United States Patent
Den Boef

(10) Patent No.: US 7,323,876 B2
(45) Date of Patent: Jan. 29, 2008

(54) MAGNETIC RESONANCE IMAGING RECEIVE CHAIN WITH DYNAMIC GAIN AND WIRELESS RECEIVER COIL

(75) Inventor: Johannes H. Den Boef, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 34 days.

(21) Appl. No.: 10/571,390

(22) PCT Filed: Sep. 1, 2004

(86) PCT No.: PCT/IB2004/051653

§ 371 (c)(1),
(2), (4) Date: Mar. 10, 2006

(87) PCT Pub. No.: WO2005/024448

PCT Pub. Date: Mar. 17, 2005

(65) Prior Publication Data

US 2006/0244452 A1 Nov. 2, 2006

Related U.S. Application Data

(60) Provisional application No. 60/501,724, filed on Sep. 10, 2003.

(51) Int. Cl.
*G01V 3/00* (2006.01)
(52) U.S. Cl. ........................ 324/322; 324/318
(58) Field of Classification Search ............... 324/322, 324/318, 309
See application file for complete search history.

(56) References Cited

U.S. PATENT DOCUMENTS

| | | | |
|---|---|---|---|
| 4,700,138 A | 10/1987 | Shimazaki et al. | 324/322 |
| 4,885,549 A | 12/1989 | Thrift et al. | 324/307 |
| 5,023,552 A | 6/1991 | Mehlkopf et al. | 324/309 |
| 5,245,288 A | 9/1993 | Leussler | 324/322 |
| 5,451,876 A | 9/1995 | Sandford et al. | 324/322 |
| 5,455,964 A | 10/1995 | Roos et al. | 455/34.2 |
| 6,111,411 A | 8/2000 | Saranathan et al. | 324/313 |
| 6,448,770 B1 | 9/2002 | Liu et al. | 324/307 |
| 6,621,433 B1 | 9/2003 | Hertz | 341/139 |
| 6,943,548 B1* | 9/2005 | Hertz | 324/309 |
| 7,123,009 B1* | 10/2006 | Scott | 324/311 |

FOREIGN PATENT DOCUMENTS

JP 59-164041 9/1984

* cited by examiner

*Primary Examiner*—Louis M. Arana

(57) ABSTRACT

Methods and apparatuses are disclosed for dynamic adjustment of the receiver gain during magnetic resonance imaging (MRI) scan. To account for distortions introduced by the receiver that may be different at various receiver gains, a reference radio frequency (rf) signal is applied to the receive chain by an additional antenna. In some disclosed embodiments the reference signal is adjusted such that its frequency lies at the border of the frequency band detected by the MR scan. Comparing the a priori known amplitude and phase of the reference signal with the amplitude and phase of the received reference signal allows determination of the distortions introduced at the respective receiver gain which are subsequently corrected. In some disclosed embodiments, the reference signal is used to synchronize the modulation and demodulation units of a wireless transceiver system.

20 Claims, 10 Drawing Sheets

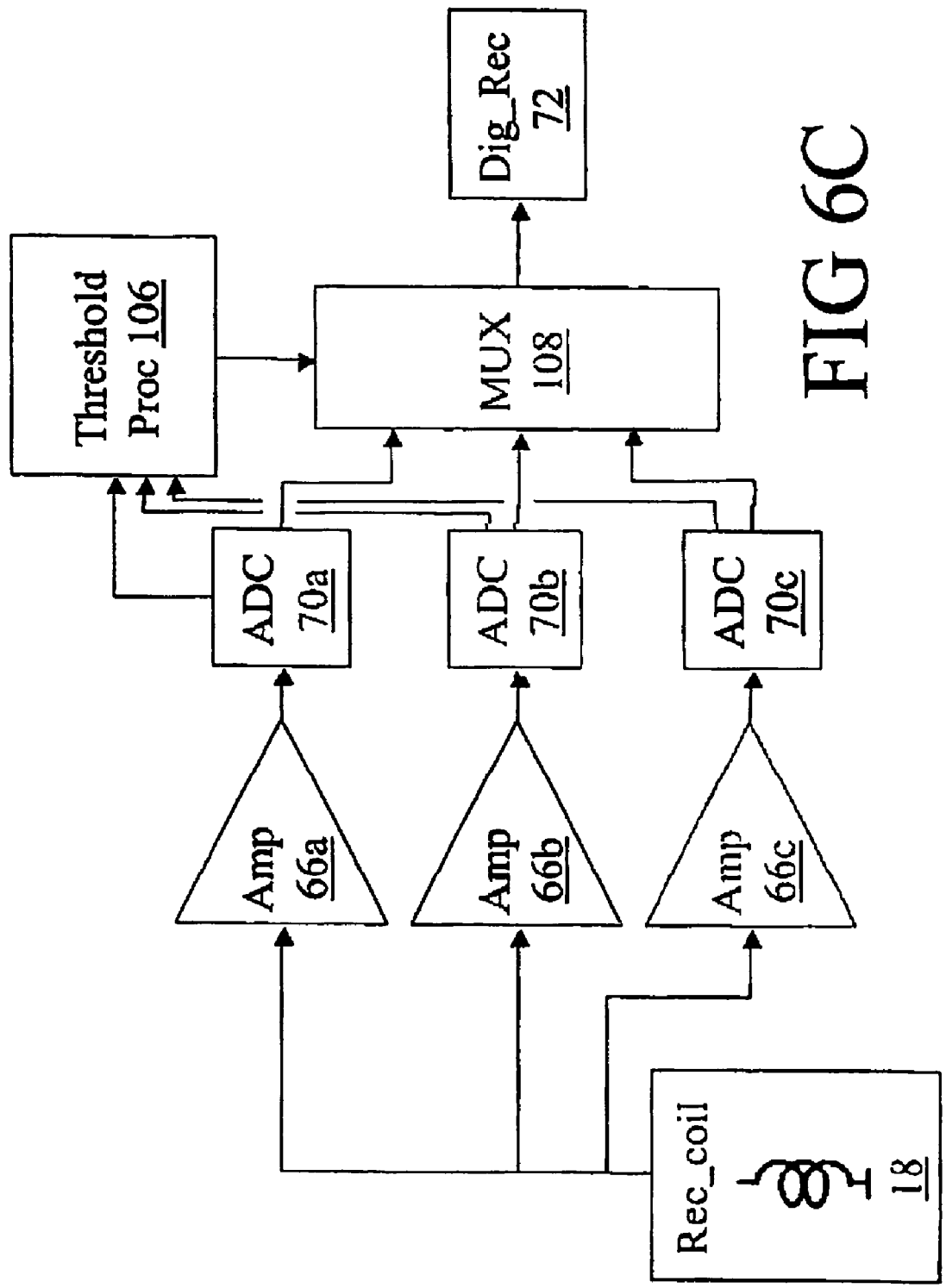

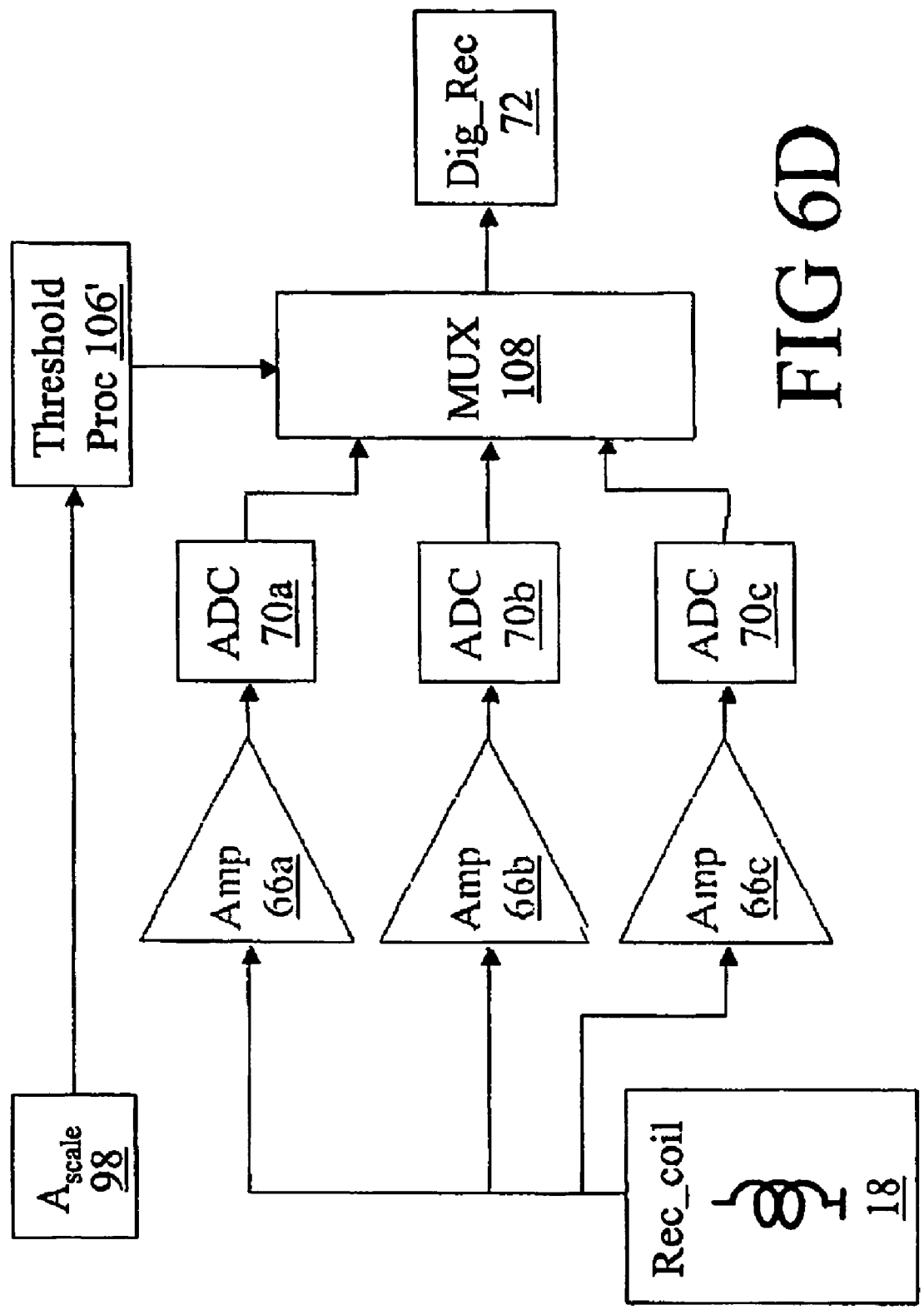

US 7,323,876 B2

Figure 1:
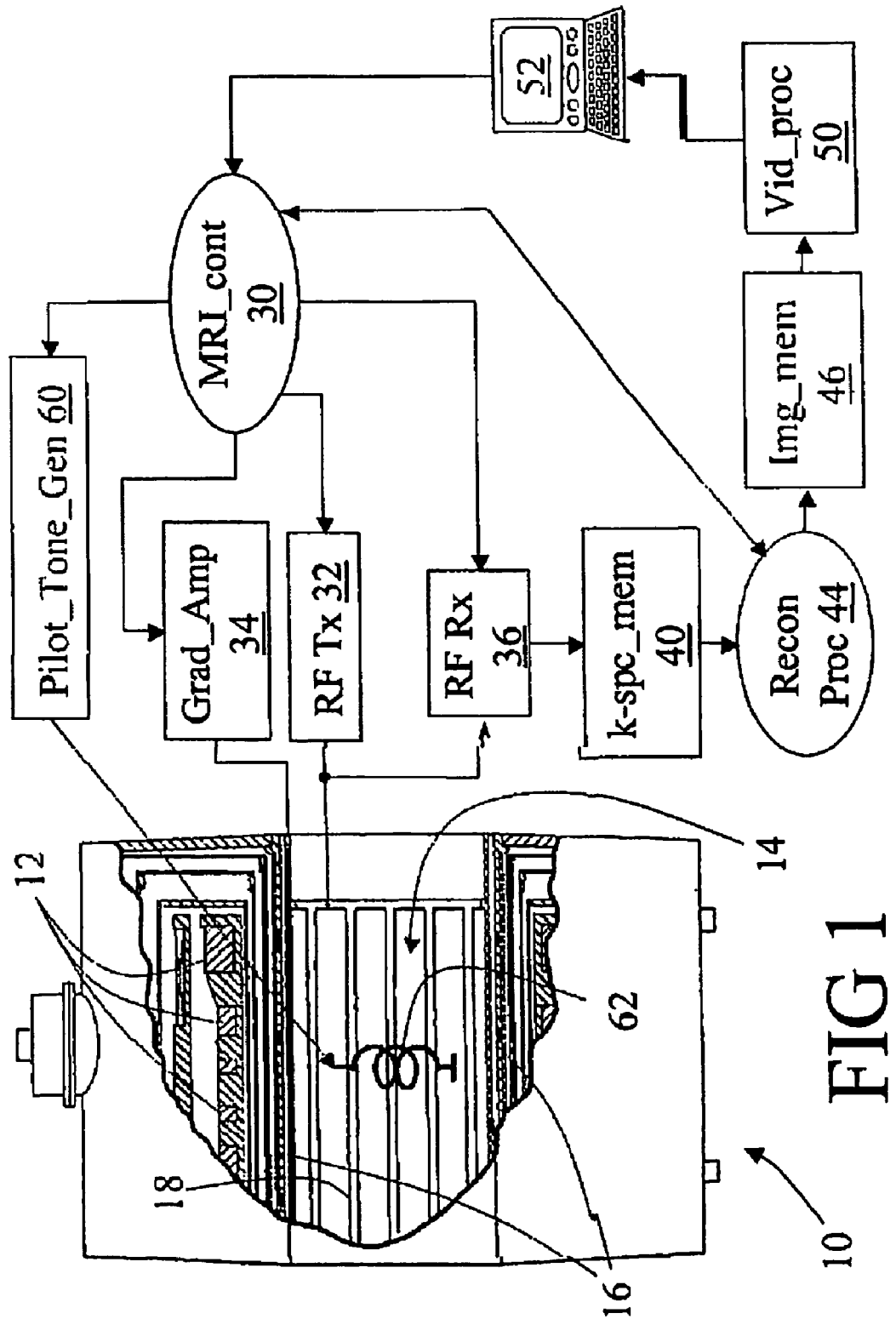

MAGNETIC RESONANCE IMAGING RECEIVE CHAIN WITH DYNAMIC GAIN AND WIRELESS RECEIVER COIL

CROSS REFERENCE TO RELATED APPLICATIONS

This application claims the benefit of U.S. provisional application Ser. No. 60/501,724 filed Sept. 10, 2003, which is incorporated herein by reference.

The following relates to the diagnostic imaging arts. It finds particular application in magnetic resonance imaging, and will be described with particular reference thereto. However, it also finds application in magnetic resonance spectroscopy and other magnetic resonance applications.

The receive chain of a magnetic resonance imaging scanner includes a number of signal processing components, such as radio frequency receive coils, radio frequency amplifiers, attenuators, analog-to-digital converters, digital receivers, and the like. In systems having a wireless receive coil, the signal processing further includes wireless transmission components for transmitting the magnetic resonance signals from the electrically isolated wireless receive coil unit to a signal processing unit that is electrically integrated with other electronics of the magnetic resonance imaging scanner.

The various components of the receive chain can introduce signal distortions into the processed magnetic resonance signal. Non-linear behavior of receiver components causes magnitude and/or phase distortions. Such non-linearities can lead to ghosting, haloing, signal-to-noise ratio distortion, blurring, and the like. If the gain of the receiver changes during or between acquisitions without accounting for the gain change in hardware or in the signal processing, ghosting or blurring can occur. For example, in profile dependent attenuation in which the receiver gain is controlled by an attenuator, the attenuation of the attenuator can drift over time due to aging, temperature effects, settling after switching, and so forth. Still further, gain instability can lead to random or periodic gain fluctuations or phase-shifting, which can produce image artifacts. In the case of a wireless receive coil, phase differences between the modulation reference of the coil unit and the corresponding demodulation reference of the signal processing unit can introduce amplitude and phase distortion in the demodulated signal.

Moreover, because the analog-to-digital converter has a finite dynamic range, substantial amplitude distortion in the receive chain can result in overloading of the analog-to-digital converter, producing a clipped digital signal or otherwise erroneous digitized data. Similarly, if the signal is at the low end of the dynamic digitizing range, the digitizing process can introduce substantial digitization noise.

The present invention contemplates an improved apparatus and method that overcomes the aforementioned limitations and others.

According to one aspect, a magnetic resonance imaging system is disclosed. A magnetic resonance scanner is provided for exciting and spatially encoding a magnetic resonance signal. A reference radio frequency signal generating means is provided for generating a reference radio frequency signal. A receiving means is provided for receiving radio frequency signals including the excited and spatially encoded magnetic resonance signal and the reference radio frequency signal. A correcting means is provided for correcting the spatially encoded magnetic resonance signal in accordance with the received reference radio frequency signal.

According to another aspect, a magnetic resonance imaging method is provided. A magnetic resonance signal is excited and spatially encoded. A reference radio frequency signal is generated. Radio frequency signals are received including the excited and spatially encoded magnetic resonance signal and the reference radio frequency signal. The magnetic resonance signal is corrected in accordance with the received reference radio frequency signal.

One advantage resides in controlling receiver gain to reduce a likelihood of overloading an analog-to-digital converter of a magnetic resonance receive chain.

Another advantage resides in reducing image distortions introduced by non-linearities, gain instabilities, gain drift, or other imperfections in the receive chain.

Yet another advantage resides in providing synchronization between wireless transmission and wireless reception in a wireless receive coil system.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system that employs a reference pilot tone to quantitatively measure signal distortions introduced by imperfections in the radio frequency receiver.

Figure 2:
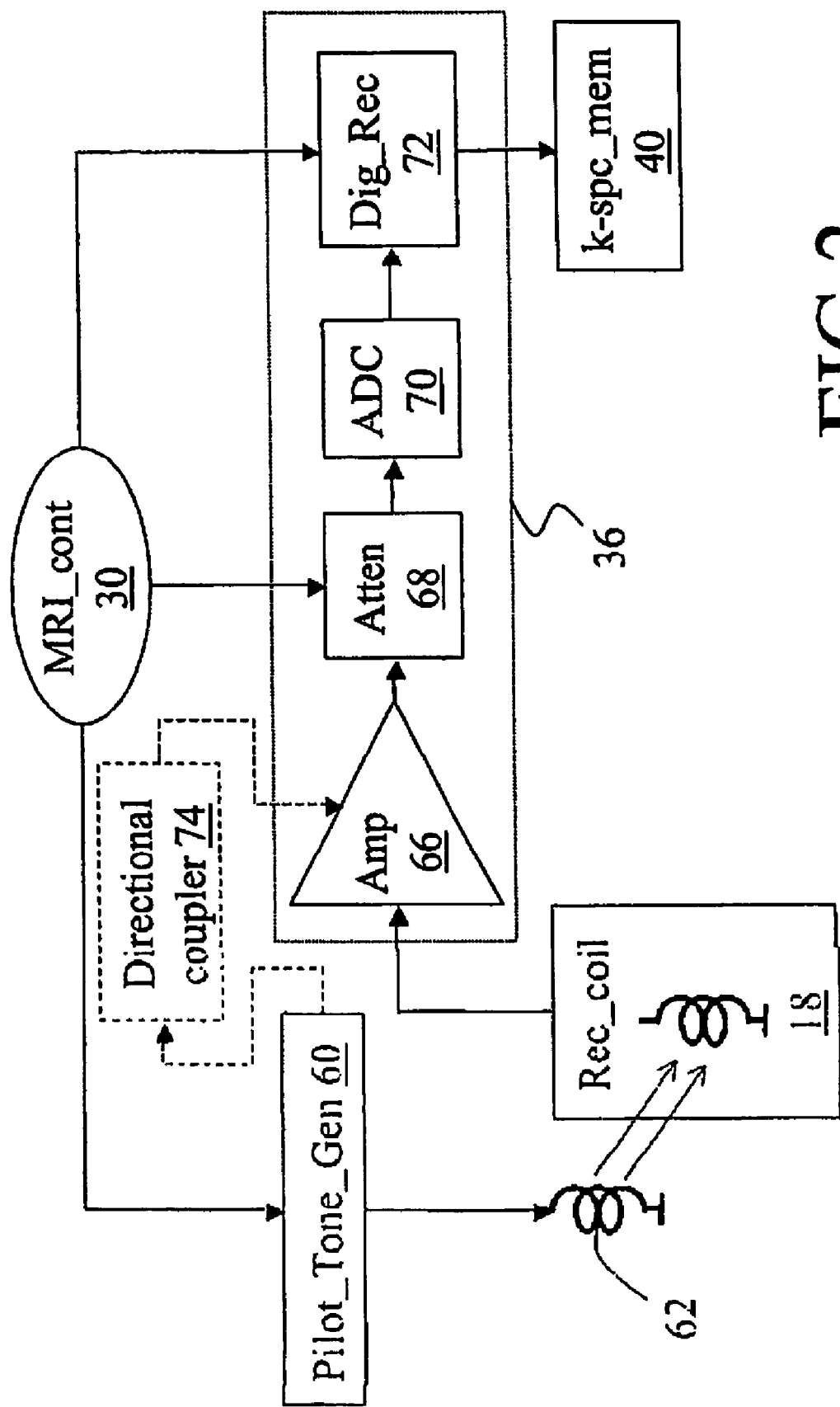

FIG. 2 diagrammatically shows an exemplary receive chain of a magnetic resonance imaging system.

Figure 3:
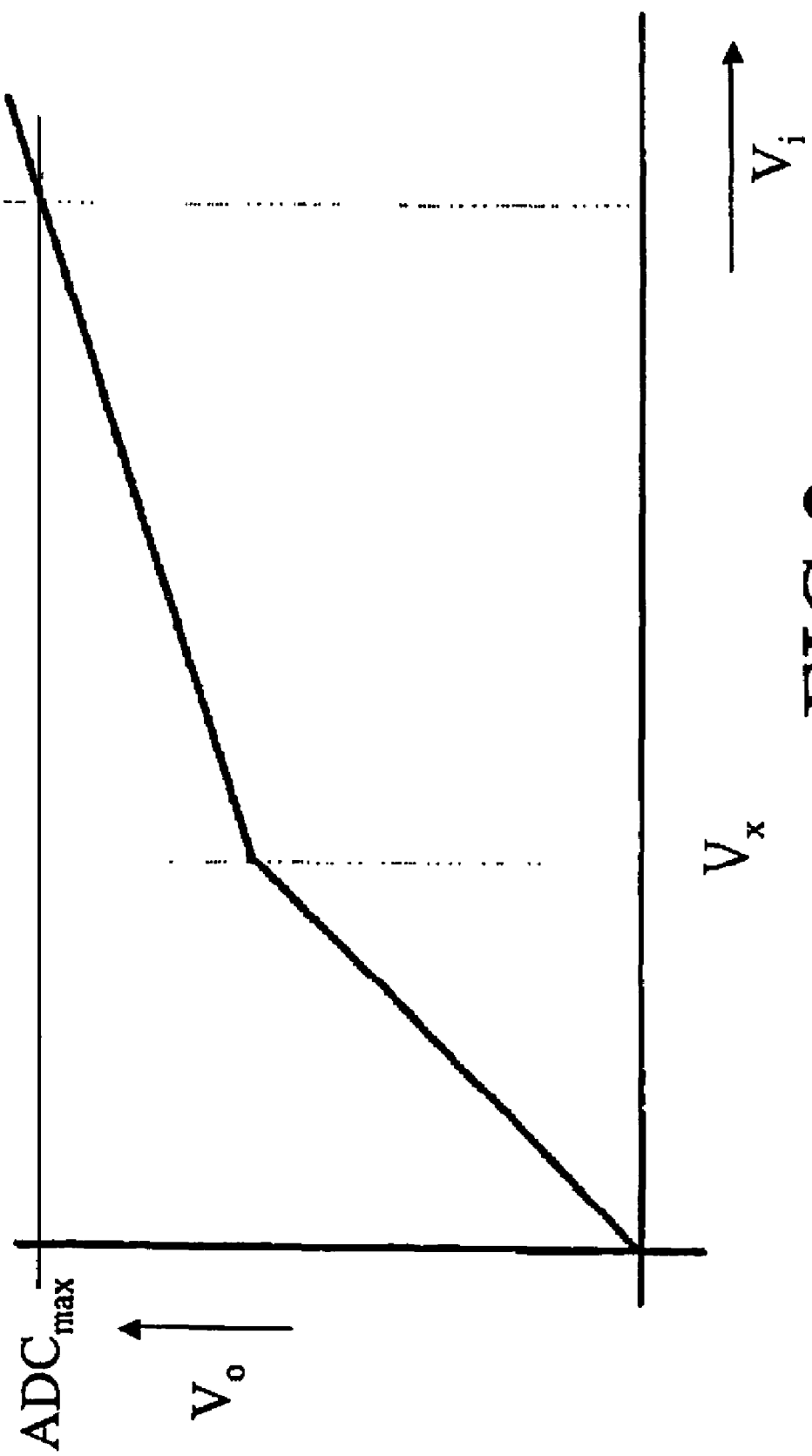

FIG. 3 shows a $V_o/V_i$ characteristic curve of an exemplary bi-linear amplifier suitable for use in a magnetic resonance imaging receive chain.

Figure 4:
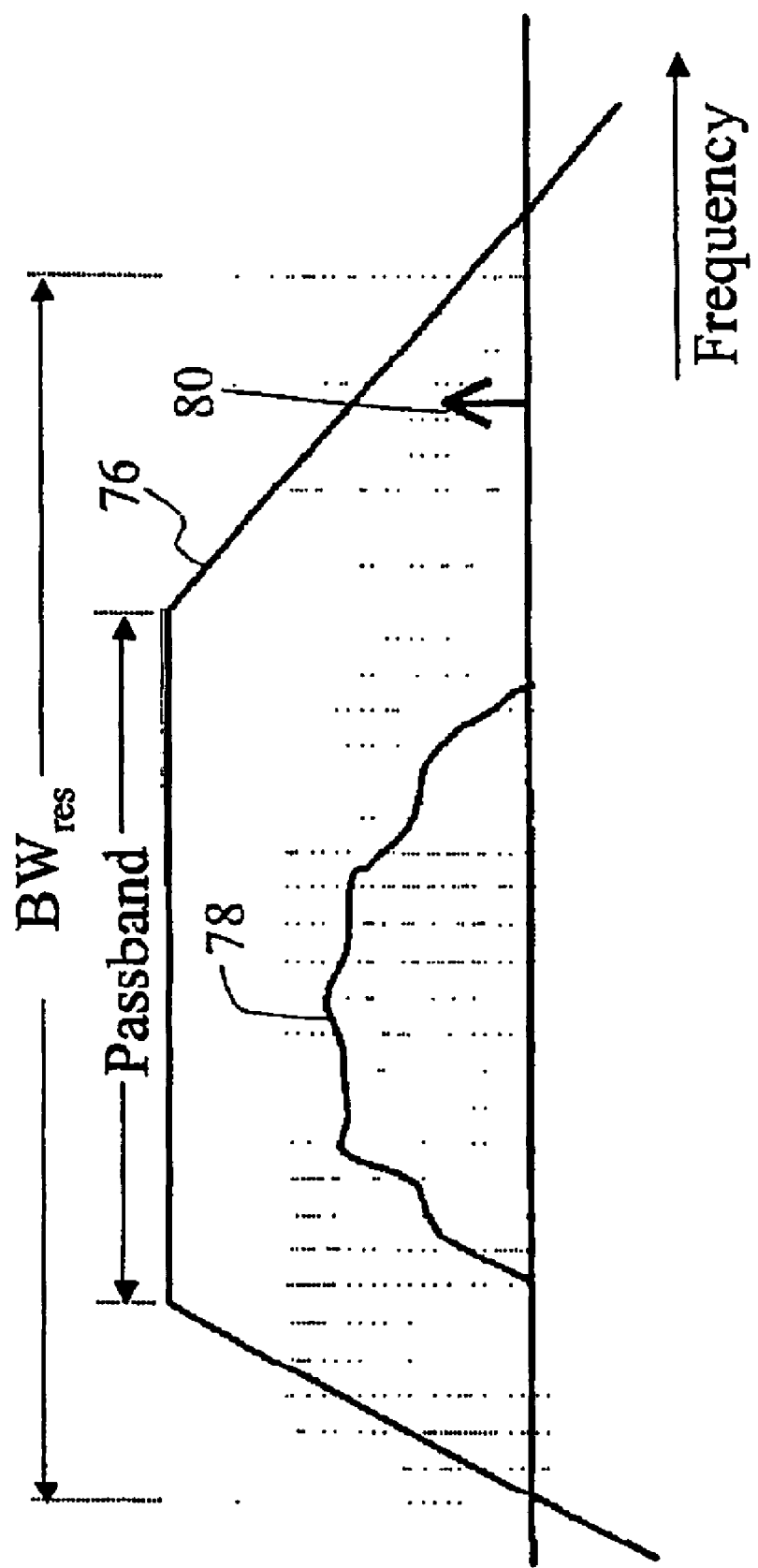

FIG. 4 diagrammatically shows a Fourier transformed profile of digitized radio frequency signals including a magnetic resonance signal and a reference pilot tone, with the receiver filter function and bins of the discrete Fourier transform superimposed.

Figure 5:
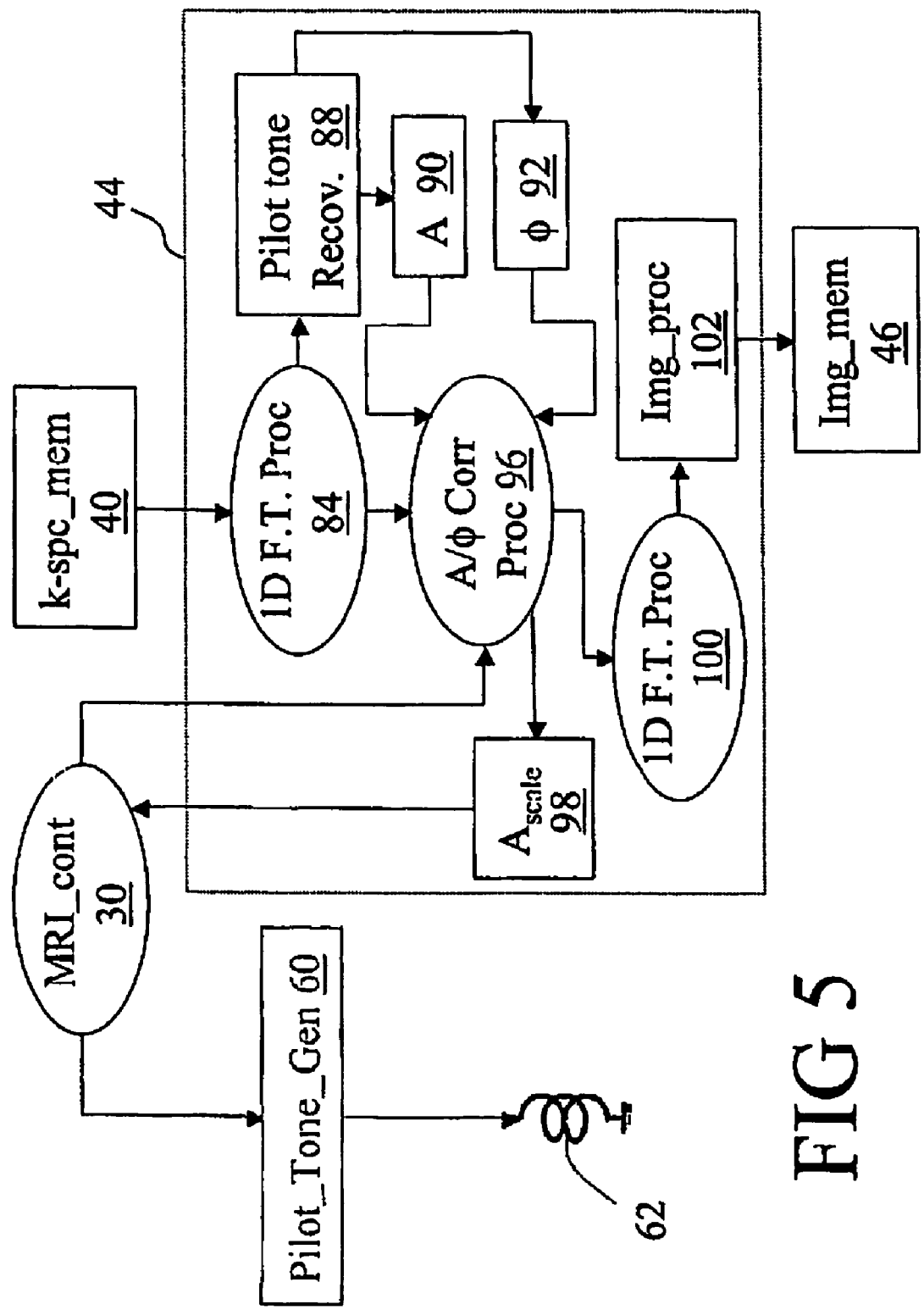

FIG. 5 diagrammatically shows the reconstruction processor of FIG. 1 including components for recovering the digitized reference pilot tone and for correcting the Fourier-transformed magnetic resonance signal based on the recovered digitized pilot tone.

FIGS. 6A, 6B, 6C and 6D diagrammatically show several embodiments of a suitable variable-gain amplifier for use in a magnetic resonance receive chain, in which automatic gain control is obtained by selection from amongst a plurality of amplifiers each having a different gain.

Figure 7:
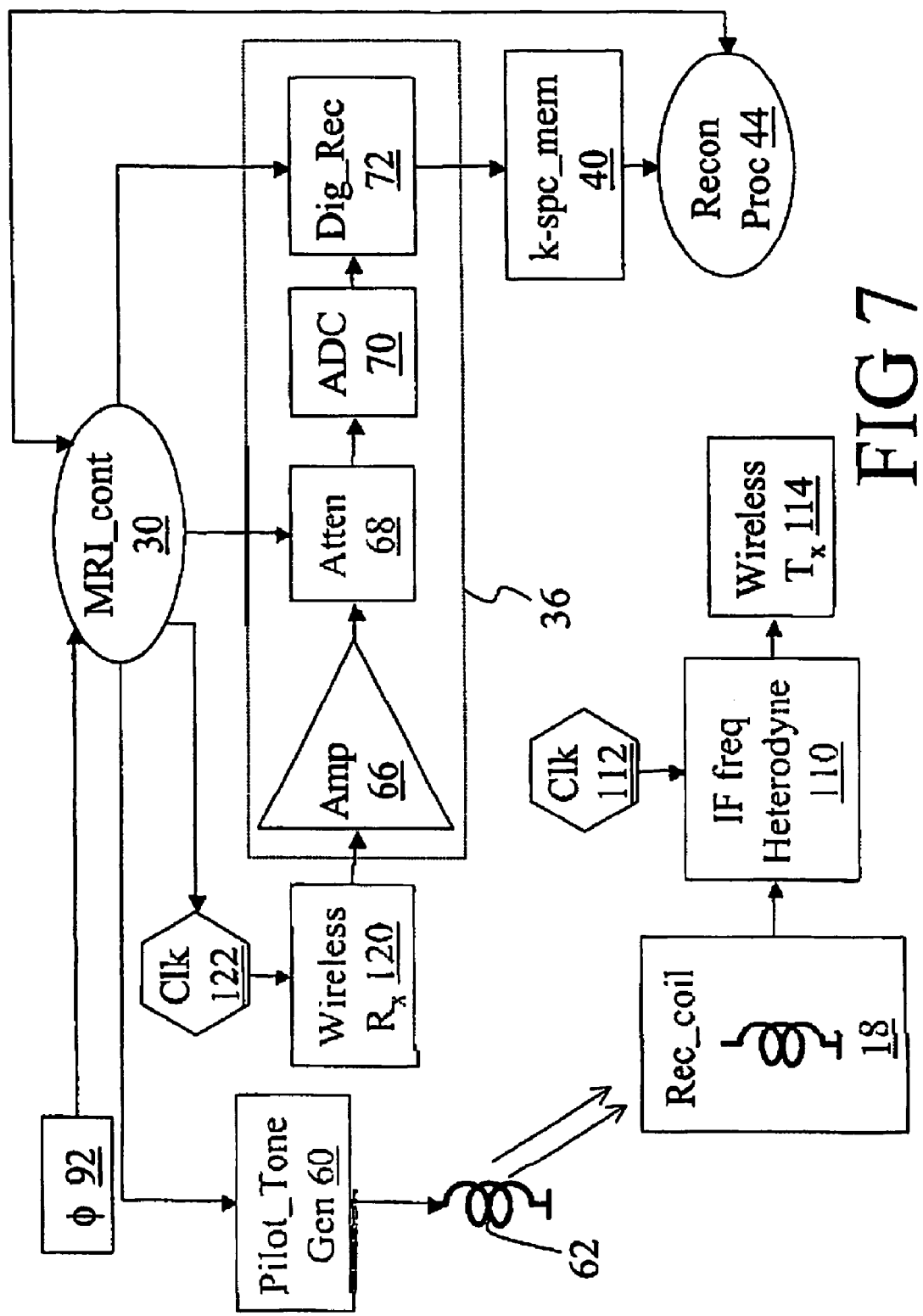

FIG. 7 diagrammatically shows an exemplary receive chain of a magnetic resonance imaging system that employs a wireless receive coil, in which the wireless receive is synchronized with the wireless transmit using the reference pilot tone.

With reference to FIG. 1, a magnetic resonance imaging scanner 10 includes main magnet coils 12, which are preferably superconducting coils, although resistive main magnet coils or a permanent magnet can also be employed. The main magnet coils 12 are energized to generate a substantially uniform main magnetic field in an examination region 14. Magnetic field gradient coils 16 produce gradients in selected spatial directions to spatially encode magnetic resonances that are generated by energizing a radio frequency coil 18. In FIG. 1, a whole-body radio frequency coil 18 is shown; however, local coils such as head coils, phased radio frequency coil arrays, sensitivity encoding (SENSE) coil arrays, and the like can be used instead of or in conjunction with the whole-body radio frequency coil 18 to excite magnetic resonances or to detect magnetic resonance signals.

A magnetic resonance sequence controller 30 coordinates and controls a radio frequency transmitter 32 that is coupled to the whole-body radio frequency coil 18 or another radio frequency coil to excite magnetic resonance signals, and controls magnetic field gradient controllers 34 coupled to the gradient coils 16 to spatially encode the excited magnetic resonance signals. One or more radio frequency receivers 36 coupled to the whole-body radio frequency coil 18 or another radio frequency coil detects, amplifies, digitizes, and demodulates the magnetic resonance signals and stores resultant digitized magnetic resonance samples in a k-space memory 40. A reconstruction processor 44 performs a Fourier transform-based image reconstruction or other type of image reconstruction to generate one or more reconstructed images from the stored k-space magnetic resonance samples.

The reconstructed images are stored in an image memory 46, processed by a video processor 50 and displayed on a user interface 52, transmitted over a local computer network or the Internet, or otherwise processed. Preferably, the user interface 52 includes a display, printer, or other output device that allows a radiologist or other operator to view, render, or otherwise manipulate the reconstructed images. Moreover, the user interface 52 preferably enables the radiologist or other operator to communicate with the magnetic resonance sequence controller 30 to select magnetic resonance imaging sequences, modify imaging sequences, execute imaging sequences, or otherwise control the magnetic resonance imaging scanner 10.

As is known in the art, the radio frequency receiver 36 includes signal processing components that perform signal conditioning, digitizing, heterodyning, or other signal processing operations on the magnetic resonance signals. It is understood that these various signal processing components may introduce non-linearities, amplitude changes, phase shifts, and other distortions to the received signal. To monitor these distortions, the magnetic resonance imaging controller 30 communicates with a pilot tone generator 60 coupled to at least one suitable pilot tone antenna 62 to generate at least one pilot tone rf field that is received by the radio frequency coil 18 or another radio frequency coil and processed along with the magnetic resonance signal by the radio frequency receiver 36. The pilot tone antenna can be disposed substantially anywhere within the bore of the magnetic resonance imaging scanner 10. Optionally, one or more flux probe coils, tuning coils, or other radio frequency coils that are typically disposed in the bore of the scanner 10 for various purposes can be employed in generating the pilot tone or tones.

With reference to FIG. 2, a typical configuration of the radio frequency receiver 36 is described. The exemplary receiver 36 includes an analog amplifier 66, an analog attenuator 68, an analog-to-digital converter 70, and a digital receiver 72. The analog front end components 66, 68 have a broad frequency bandwidth. A nominal gain, that is, a receiver gain at a 0 dB attenuation setting of the attenuator 68, is selected such that the noise of the analog-to-digital converter 70 has negligible influence on the overall noise figure of the receiver 36.

The gain of the receiver 36 is controlled by the controller 30 communicating with the attenuator 68 to set the attenuation to ensure that the received radio frequency signal does not overflow the analog-to-digital converter 70. The expected radio frequency signal level can be predicted using a predictive model. Several models could be used, such as a model that predicts the magnetic resonance signal level based on the sample location in k-space. The received frequency band is determined by the controller 30 adjusting one or more settings of the digital receiver 72. The setting of a reference synthesizer of the digital receiver 72 determines the carrier frequency of the received frequency band. The output data rate determines the bandwidth of the received frequency band.

With reference to FIG. 3, the amplifier 66 is optionally a bi-linear amplifier having the amplification characteristic $(V_o/V_i)$ shown in FIG. 3. The bi-linear amplifier has a first differential gain for input voltages below a threshold voltage $V_x$, and second, lower differential gain for input voltages above the threshold voltage $V_x$. In similar fashion, a tri-linear or higher complexity amplifier having successively lower differential gain for higher input voltages can be used to provide an extended amplification dynamic range. If the amplifier 66 is a bi-linear amplifier, a tri-linear amplifier, or other variable-gain amplifier, then the attenuator 68 is optionally omitted from the receive chain.

The receiver embodiments described with reference to FIGS. 2 and 3 are exemplary only. Those skilled in the art can substitute other receiver components for the described exemplary components. For example, demodulation performed on the digital side by the digital receiver 72 can instead be performed on the analog side by an analog demodulator, followed by digitizing of the demodulated signal. In another contemplated embodiment, an analog heterodyning mixer shifts the received radio frequency signals to an intermediate frequency prior to digitizing and final digital demodulation. The reference pilot tone based distortion correction methodology described herein is generally applicable to any receive chain configuration that is suitable for use in magnetic resonance imaging. Those skilled in the art recognize that substantially any such suitable receiver may introduce undesirable signal distortions in the radio frequency receive coil, in the analog components, in the analog-to-digital conversion process, or elsewhere in the receive chain.

To provide a mechanism for correcting these distortions, the pilot tone antenna 62 is arranged to produce one or more reference pilot tone signals that are received by the radio frequency coil 18 (the received pilot tone signal is diagrammatically indicated by arrows in FIG. 2). Rather than being communicated by airwave transmission, the reference pilot tone can be directly injected at a selected point within the analog front end 66, 68 of the receive chain, for example using a directional coupler 74 (an alternative coupling path that injects the pilot tone into the amplifier 66 using the coupler 74 is shown in phantom in FIG. 2).

The pilot tone generator 60 generates a monotone or multi-tone radio frequency reference pilot tone signal that is communicated to the radio frequency receiver 36 by the receive coil 18 or the directional coupler 74. The receiver 36 processes received radio frequency signals including at least the magnetic resonance signal and the reference pilot tone radio frequency signal. The magnetic resonance signal and the reference pilot tone or tones together undergo amplification by the amplifier 66, attenuation by the attenuator 68, digitizing by the analog-to-digital converter 70, and demodulation and optional further signal processing by the digital receiver 72. The digitized radio frequency signals are stored in the k-space memory 40. In the alternative bi-linear amplifier embodiment, the magnetic resonance signal and the reference pilot tone or tones together undergo the bi-linear amplification indicated by the amplifier gain function shown in FIG. 3, followed by digitizing by the analog-to-digital converter 70 and subsequent digital signal processing by the digital receiver 72.

With reference to FIG. 4, the receive chain processing is described graphically with reference to the frequency spectrum shown in FIG. 4. The receiver 36 defines a filter transfer function 76 which has a resolved bandwidth $BW_{res}$ over which digitized data is obtained, and a central passband over which the receiver gain is substantially constant. The magnetic resonance signal indicated by exemplary frequency spectrum 78 preferably lies within the central passband to minimize distortion introduced by insertion of the receiver filter 76. The frequency spectrum 78 is suitably obtained from the acquired and digitized radio frequency magnetic resonance signal by applying a discrete Fourier transform.

The digitized and Fourier transformed radio frequency signals also include the reference pilot tone component of the digitized radio frequency signals. The reference pilot tone component is indicated by exemplary monotone component 80, which preferably lies outside the passband, that is, outside the utilized band of the magnetic resonance signal 78, to avoid interference between the magnetic resonance signal and the reference pilot tone signal. Additionally, the pilot tone 80 preferably lies well within the resolved bandwidth $BW_{res}$ of the receiver filter 76 to minimize pilot tone signal loss due to insertion of the receiver filter 76. The level of the pilot tone is preferably set such that it does not substantially limit dynamic range performance of the analog-to-digital converter 70. A pilot tone of about 1% to 10% of the range of the analog to digital converter 70 is preferred, although higher or lower pilot tone levels can be employed. Moreover, rather than the illustrated exemplary monotone reference pilot tone component 80, the reference pilot tone can be multi-tonal, for example with reference pilot tone frequency components lying both above and below the passband of the magnetic resonance signal 78.

With adequate frequency separation between the magnetic resonance signal 78 and the reference pilot tone 80 components of the digitized radio frequency signals, the pilot tone generator 60 can be operated continuously or concurrently with magnetic resonance signal acquisition. In an alternative embodiment, the pilot tone frequency lies within the frequency range of the magnetic resonance signal, that is, within the passband. In this frequency-overlapping embodiment, operation of the reference pilot tone generator 60 is temporally interleaved with acquisition of encoded lines of k-space to avoid interference between the magnetic resonance signal component 78 and the pilot tone component 80.

With continuing reference to FIGS. 1 and 4, and with further reference to FIG. 5, the digitized radio frequency signals stored in the k-space memory 40 are processed by the reconstruction processor 44 to produce one or more reconstructed images that are stored in the image memory 46. In a preferred embodiment, the reconstruction processor 44 includes a Fourier transform processor 84 that applies a discrete one-dimensional Fourier transform in the frequency direction, which is preferably a discrete fast Fourier transform, to each magnetic resonance readout profile or line of k-space to transform the digitized radio frequency signals into frequency spectrum bins. Boundaries of frequency bins of the discrete Fourier transform are diagrammatically indicated in FIG. 4 by vertical dotted lines. In a preferred embodiment, the frequency of the pilot tone component 80 of the digitized radio frequency signals is selected to lie within one of the frequency bins, as shown in FIG. 4. Alternatively, the Fourier transform processor 84 can frequency-shift the data to place the digitized reference pilot tone 80 within a frequency bin.

A pilot tone recovery processor 88 recovers the digitized pilot tone component 80 of the digitized radio frequency signals by accessing the Fourier transform frequency bin corresponding to the frequency of the reference pilot tone. For each setting of the attenuator 68, the average magnitude (A) 90 and phase ($\phi$) 92 of the frequency bin containing the pilot tone component 80 is determined. The frequency of the pilot tone is preferably selected such that an integer number of pilot tone periods per profile are measured for optimal signal-to-noise ratio of the pilot tone frequency bin.

A magnitude/phase correction processor 96 compares the recovered digitized magnitude 90 and phase 92 of the recovered reference pilot tone with the a priori known reference pilot tone magnitude and phase, supplied by the controller 30, to determine a relative scale factor ($A_{scale}$) 98 and phase correction factor with respect to the determined no attenuation level. These values represent the distortion introduced by the receiver 36 and provide real-time calibrated attenuator values. These values can be used in various ways to correct for distortions introduced by the radio frequency receiver 36.

In one correction approach, the attenuator calibration values are used to scale and phase-shift the one-dimensional Fourier transformed profiles or lines to correct for distortions introduced by the receive chain. The distortion-corrected frequency profiles are processed by a second Fourier transform processor 100 that performs a one-dimensional discrete Fourier transform on the magnitude- and phase-corrected one-dimensional Fourier transformed profiles along a direction transverse to the frequency encode direction of k-space to generate a reconstructed image. The Fourier transform processor 100 preferably performs a one-dimensional fast Fourier transform. Optionally, an image processor 102 performs additional processing to correct for magnetic field non-uniformities or other known image degradation, and the reconstructed image is stored in the image memory 46.

Rather than, or in addition to, correcting the acquired and Fourier-transformed profiles, the relative scale factor 98 can be input to the magnetic resonance imaging controller 30 and used to provide real-time adjustment of the setting of the attenuator 68 to correct for attenuator drift due to aging, temperature shifts, or the like. Moreover, the relative scale factor 98 can be monitored to detect when the amplified input to the analog-to-digital converter 70 is close to going out-of-range, so that a suitable adjustment can be made to the attenuator setting, to a setting of a bi-linear amplifier, or to another receiver gain control setting to keep the input to the analog-to-digital converter 70 well within the dynamic range of the converter 70. For example, the gain factors of the selectable gain signal amplifier described in U.S. Pat. No. 5,023,552 issued to Mehlkopf et al. are readily adjusted in real-time or close to real-time using the relative scale factor 98.

Figure 6A:
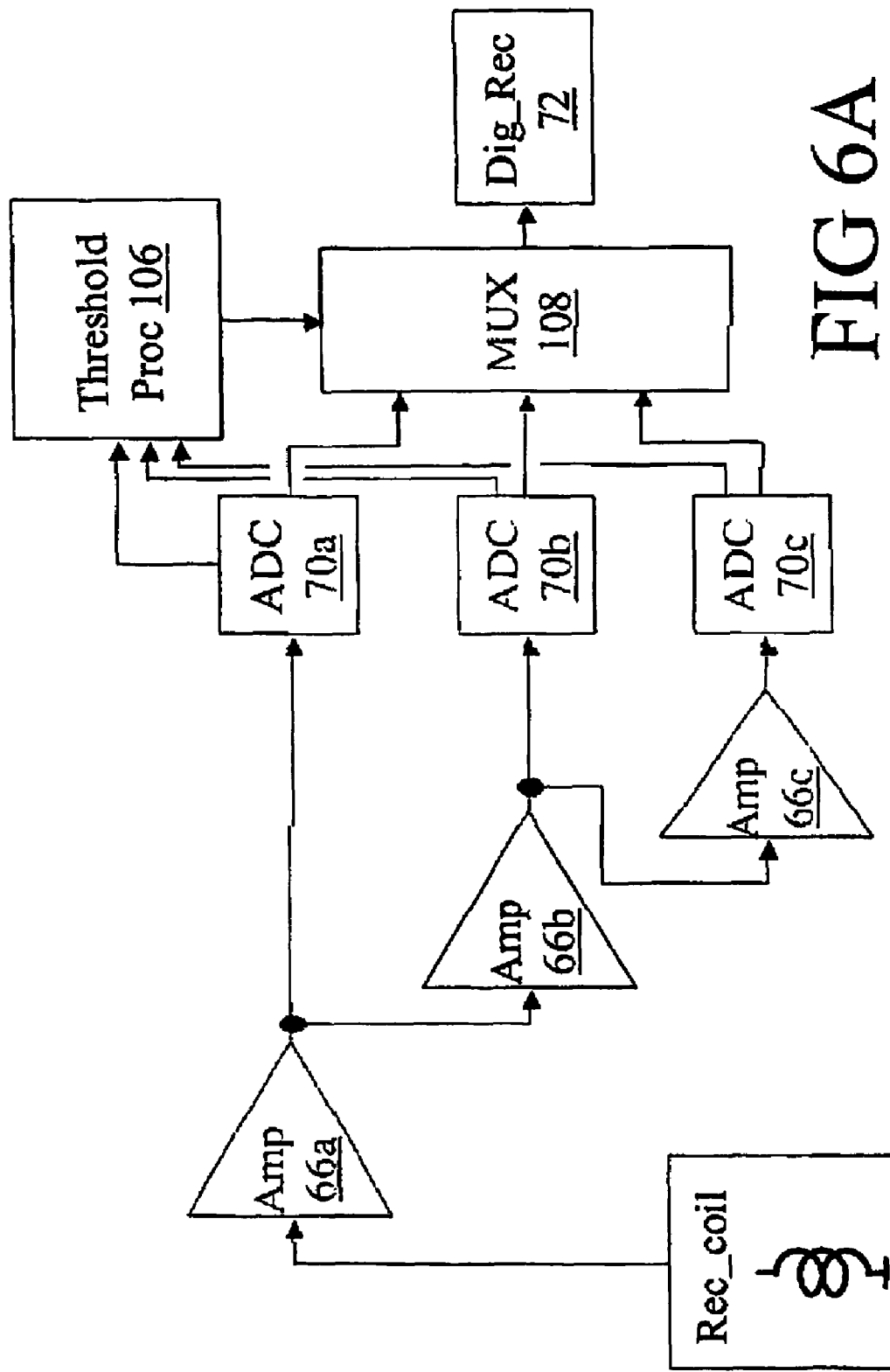
Figure 6B:
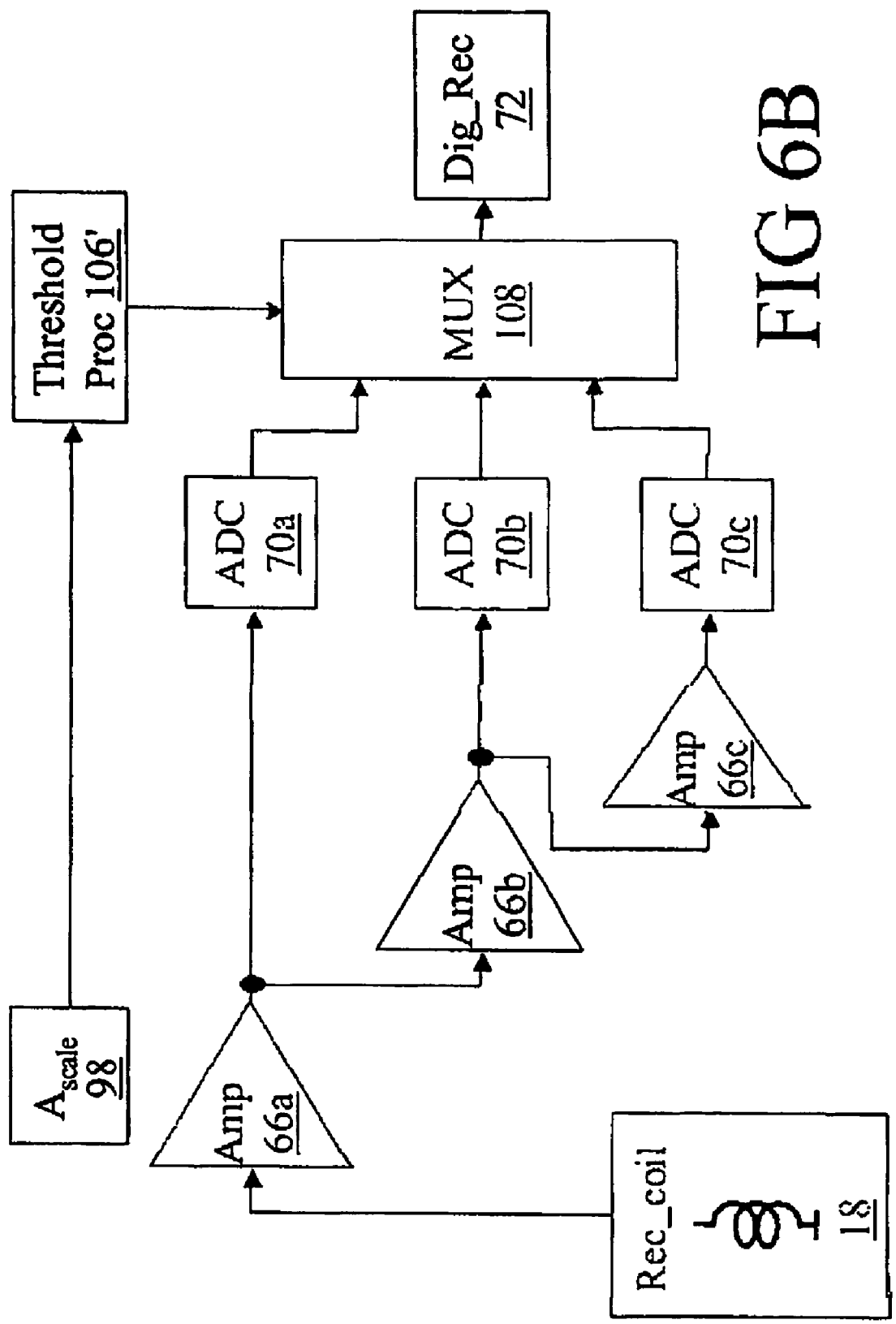

With reference to FIGS. 6A, 6B, 6C and 6D, another approach for providing real-time or near real-time feedback control of the gain of the amplifier 66 is described. The amplifier 66 is replaced by a plurality of amplifiers, namely three exemplary amplifiers 66a, 66b, 66c each having a different gain. FIGS. 6A, 6B, 6C, and 6D show several embodiments that differ based on interconnections and control signals. In FIGS. 6A and 6B the amplifiers are connected in series while in FIGS. 6C and 6D each amplifier input is driven by the output of the receive coil 18. Each amplifier 66a, 66b, 66c provides amplified radio frequency input to a corresponding analog-to-digital converter 70a, 70b, 70c to produce three different digitized outputs each having a different gain. It will be appreciated that for a radio frequency input from the receive coil 18 of large magnitude, higher gain amplifiers may have clipped digitized output. In FIGS. 6A and 6C a threshold processor 106 provides a selection signal to the multiplex or 108 based on the status of the overflow bit of each ADC such that the output of the ADC digitizing the highest signal level without overflow is forwarded by the multiplexer to the digital receiver 72. In FIGS. 6B and 6D, a threshold processor 106' thresholds based on the relative scale factor ($A_{scale}$) 98 to provide a selection signal that is input to a multiplexer 108 that selects one of the digitized outputs based on the magnitude of the relative scale factor ($A_{scale}$) 98.

For example, if the amplifiers 66a, 66b and 66c all have a positive gain and the analog-to-digital converter 70c produces an overflow signal, indicating that the input signal overloads the converter, then the threshold processor 106 produces a selection signal that selects a lower-gain channel such as the channel 66b, 70b as the input to the digital receiver 72. In the receive chains of FIGS. 6A, 6B, 6C and 6D, the attenuator 68 is preferably omitted. Moreover, although three amplifiers 66a, 66b, 66c are shown in each of the embodiments shown in FIGS. 6A, 6B, 6C and 6D, it will be appreciated that two amplifiers or more than three amplifiers can be similarly employed to suitably match amplification with the dynamic range of the analog-to-digital converter for the selected amplification channel.

Real-time control based on the reference pilot tone can also be used to provide automatic gain stabilization of the radio frequency receiver 36. The gain of the receiver may drift over time during acquisition of magnetic resonance data, for example due to changing temperature or other environmental conditions. The receive coil 18 is typically the most sensitive component of the receive chain to such changing conditions. In applying the automatic gain stabilization, the frequency response $y(\omega)$ of the receive coil 18 is represented by a parameterized analytical function such as a Q-curve:

$$y(\omega) = \sqrt{\frac{1}{1+\left(\frac{2Q(\omega - \omega_o)}{\omega_o}\right)^2}}, \quad (1)$$

where Q is defined as the 3 dB bandwidth of the tuned coil 18, that is, $Q = \omega_0/\omega_{3\,dB}$. For the single-parameter Q-curve model of Equation (1), a single reference pilot frequency tone is sufficient to determine behavior of the Q parameter and hence to determine response changes for the magnetic resonance signal frequency band.

If the frequency response model is more complex and includes more than one parameter, then the response behavior should be determined at more than one frequency in order to determine the dynamic behavior of the plurality of model parameters. This can be done by generating a multi-tone reference pilot tone signal in which the individual tones have separate frequencies that do not overlap with the magnetic resonance signal passband. Best performance is typically obtained when the pilot tones are distributed over the two filter transition bands, i.e. the above and below the passband. The frequency spacing between pilot tones in each of the above-passband transition band and the below-passband transition band does not need to be constant. The monitored pilot tones are preferably arranged in frequency bins of the discrete Fourier transform 84 that contain at most a small magnetic resonance signal component. This can be accomplished by performing a fast preparation acquisition without a phase encoding gradient, Fourier transforming this acquisition and identifying transition band frequency bins with sufficient spacing and limited magnetic resonance signal levels. Optionally, frequency bins lying within the passband but which do not contain substantial magnetic resonance signal can be used.

Environmental changes contributing to instabilities of the receive coil 18 typically do not change rapidly in time. Thus, the automatic gain stabilization is optionally performed in something less than real-time. For example, the coil sensitivity changes can be measured between magnetic resonance signal acquisitions, in which case the multi-tonal reference pilot signals can be placed at frequencies of the magnetic resonance signal. This approach advantageously allows direct measurement of changes in the magnetic resonance signal band. Indeed, if a broadband multi-tonal reference is employed in this manner the frequency response $y(\omega)$ can be measured directly without reference to a parameterized analytical function such as the Q-curve model of Equation (1).

With reference to FIG. 7, an application of the reference pilot tone methodology to a wireless receive coil is described. FIG. 7 shows a receive chain similar to that of FIG. 2, except that in FIG. 7 a wireless connection is provided between the receive coil 18 and the radio frequency receiver 36. The receive coil 18 is coupled to a heterodyning mixer 110 that shifts the radio frequency signals to an unused frequency band by mixing the radio frequency signals with an intermediate frequency (IF) reference signal provided by free-running clock 112. A wireless transmitter 114 wireless transmits the heterodyned radio frequency signals. A wireless receiver 120 electrically connected with the receiver 36 receives and demodulates the heterodyned radio frequency signals to recover the original radio frequency signals by mixing the heterodyned radio frequency signals with a reference signal provided by a second clock 122 having not necessarily the same frequency as the free-running coil-side clock 112. In one embodiment in which the receiver 36 is tuned to receive signals in the frequency band used by the wireless transmitter 114, the wireless receiver 120 passes the received signal directly to the radio frequency receiver 36 without first performing demodulation.

The wireless coil connection described with reference to FIG. 7 is similar in certain aspects to a wireless coil connection described in U.S. Pat. No. 5,245,288 issued to Leussler. However, the wireless coil connection described with reference to FIG. 7 differs from that described in U.S. Pat. No. 5,245,288 at least in that the reference pilot tone output by the radio frequency antenna 62 provides for correction of the non-synchronization of the clocks 112, 122. Without such correction, problems can arise in the wireless coil connection due to phase differences between the reference signals produces by the clocks 112, 122, which can lead to ghosting in the reconstructed images. As indicated in FIGS. 5 and 7, the phase error due to the free running clocks 112, 122 is suitably determined in the reconstruction processor 44 by comparing the phase (φ) 92 of the recovered digitized reference pilot tone 80 with the a priori known phase of the pilot tone produced by the pilot tone generator 60. The determined phase difference can be used by the reconstruction processor 44 to phase correct the obtained frequency profiles.

Some MR applications, like radial and EPI, acquire magnetic resonance signals using a non-constant read-out gradient. Normally the acquired samples are processed with some kind of griddling algorithm in order to obtain a Cartesian k-space matrix which allows fast Fourier transforms to be used to obtain the required images. For such applications the pilot tone generator is preferably amplitude and phase or frequency modulated such that the recovered pilot tone signal is still readily detectable.

In another embodiment of the invention, a separate digital receiver is used to recover the pilot tone. This embodiment is especially useful when the pilot tone is not within the resolved bandwidth of the digital receiver receiving the magnetic resonance signals. This will most likely be used when strong interactions like inter-modulation distortion of the magnetic resonance signals and the pilot tone are to be expected.

The described applications of the reference pilot tone or tones are exemplary only. Those skilled in the art can construct readily adapt these exemplary embodiments and the underlying reference pilot tone based distortion correction methodology for correcting various other imperfections in the receive chain based on the recovered pilot tone or tones. Provided that the pilot field and the ideal transfer function between the pilot field and the receive coil of the receiver remain known or constant, substantially any type of imperfection in the receive chain can be quantitatively analyzed using the recovered reference pilot tone and a suitable correction fashioned therefrom.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A magnetic resonance imaging system including:
   a magnetic resonance scanner for exciting and spatially encoding a magnetic resonance signal;
   an antenna for communicating a reference radio frequency signal by airwave transmission;
   a radio frequency coil and coupled radio frequency receiver for receiving radio frequency signals including the excited and spatially encoded magnetic resonance signal and the reference radio frequency signal; and
   a correcting means for correcting the spatially encoded magnetic resonance signal in accordance with the received reference radio frequency signal.

2. The magnetic resonance imaging system as set forth in claim 1, wherein the antenna is selected from a group consisting of a flux probe coil and a tuning coil.

3. A magnetic resonance imaging system including:
   a magnetic resonance scanner for exciting and spatially encoding a magnetic resonance signal;
   a reference radio frequency signal generating means for generating a reference radio frequency signal;
   a receiving means for receiving radio frequency signals including the excited and spatially encoded magnetic resonance signal and the reference radio frequency signal;
   a signal processing means for performing signal processing on the received radio frequency signals, the signal processing means including:
      a signal conditioning means for conditioning the received radio frequency signals to produce conditioned radio frequency signals,
      a digitizing means for a convening the conditioned radio frequency signals into digitized radio frequency signals, and
      a reconstruction means for reconstructing at least a magnetic resonance signal component of the digitized radio frequency signals into a reconstructed image; and
   a correcting means for correcting the spatially encoded magnetic resonance signal in accordance with the received reference radio frequency signal, the correcting means includes:
      a reference signal recovery means for recovering a reference radio frequency signal component of the digitized radio frequency signals, and
      a control means for controlling the signal processing means based on comparison of the reference radio frequency signal component of the digitized radio frequency signals and the reference radio frequency signal.

4. The magnetic resonance imaging system as set forth in claim 3, wherein the signal conditioning means includes:
   an amplifying means for amplifying the received radio frequency signals with a selectable amplification gain.

5. The magnetic resonance imaging system as set forth in claim 4, wherein the control means includes:
   an amplitude comparing means for producing an amplitude control parameter based on comparison of an amplitude of the reference radio frequency signal component of the digitized radio frequency signals and an amplitude of the reference radio frequency signal; and
   an automatic gain control means for adjusting the selectable amplification gain of the amplifying means based on the amplitude control parameters.

6. The magnetic resonance imaging system as set forth in claim 5, wherein the amplifying means includes:
   a plurality of constant-gain amplifiers, the automatic gain control means selecting one or more of the constant-gain amplifiers for amplifying the received radio frequency signals.

7. The magnetic resonance imaging system as set forth in claim 6, wherein the automatic gain control means includes:
   a plurality of analog-to-digital converters corresponding to the plurality of constant-gain amplifiers, each analog-to-digital converter outputting a digitized signal; and
   a selection means that selects the highest output digitized signal for which the corresponding analog-to-digital converter is not overloaded.

8. The magnetic resonance imaging system as set forth in claim 5, wherein the amplifying means includes:
   an amplifier; and
   an attenuator;
   wherein the automatic gain control means adjusts an attenuation of the attenuator to effect the selectable amplification gain based on the amplitude control parameters.

9. The magnetic resonance imaging system as set forth in claim 3, wherein the control means includes:
   a phase comparing means for producing a phase shift parameter based on comparison of a phase of the reference radio frequency signal component of the digitized radio frequency signals and a phase of the reference radio frequency signal.

10. The magnetic resonance imaging system as set forth in claim 9, wherein the control means further includes:
a phase correction means communicating with the signal conditioning means for correcting a phase shift introduced by the signal conditioning means based on the phase shift parameter.

11. The magnetic resonance imaging system as set forth in claim 9, wherein the receiving means is electrically isolated from the signal processing means, the system further including:
a wireless transmitting means communicating with the receiving means for wireless transmitting a heterodyned signal formed by mixing the received radio frequency signals and a transmitter reference signal;
a wireless receiving means communicating with the signal processing means for wireless receiving the heterodyned signal and for recovering the received radio frequency signals; and
a correcting means for correcting a synchronization difference between the receiver reference signal and the transmitter reference signal based on the phase shift parameter.

12. The magnetic resonance imaging system as set forth in claim 3, wherein:
the reconstruction means includes a Fourier transform means for converting the digitized radio frequency signals to produce a frequency spectrum; and
the reference signal recovery means includes a means for reading a selected frequency component of the frequency spectrum corresponding to a frequency of the reference radio frequency signal.

13. The magnetic resonance imaging system as set forth in claim 12, wherein the control means includes one of
an amplitude correction means for amplitude scaling a magnetic resonance signal component of the frequency spectrum based on comparison of an amplitude of a reference radio frequency signal component of the frequency spectrum with an amplitude of the reference radio frequency signal, and
a phase comparing means for phase shifting a magnetic resonance signal component of the frequency spectrum based on comparison of a phase of a reference radio frequency signal component of the frequency spectrum with a phase of the reference radio frequency signal.

14. A magnetic resonance imaging method including:
exciting and spatially encoding a magnetic resonance signal;
generating a reference radio frequency signal;
receiving radio frequency signals including the excited and spatially encoded magnetic resonance signal and the reference radio frequency signal; and
correcting the magnetic resonance signal in accordance with the received reference radio frequency signal.

15. The magnetic resonance imaging method as set forth in claim 14, further including:
conditioning the received radio frequency signals to produce conditioned radio frequency signals;
converting the conditioned radio frequency signals into digitized radio frequency signals; and
reconstructing at least a magnetic resonance signal component of the digitized radio frequency signals into a reconstructed image; and
wherein the correcting of the magnetic resonance signal includes:
recovering a reference radio frequency signal component of the digitized radio frequency signals, and
controlling at least one of the conditioning, the converting, and the reconstructing based on comparison of the reference radio frequency signal component of the digitized radio frequency signals and the reference radio frequency signal.

16. The magnetic resonance imaging method as set forth in claim 15, wherein:
the reconstructing includes griddling and Fourier transforming the digitized radio frequency signals to produce banned frequency components stored in frequency bins; and
the generating of a reference radio frequency signal includes generating a modulated reference radio frequency signal;
wherein the reference radio frequency signal component of the digitized radio frequency signals includes a single or multi-tone reference frequency signal each corresponding to one of the frequency bins.

17. The magnetic resonance imaging method as set forth in claim 15, wherein:
the conditioning of the received radio frequency signals includes amplifying the received radio frequency signals prior to the converting using a hi-linear amplifier; and
the controlling of at least one of the conditioning, the converting, and the reconstructing includes controlling the hi-linear amplifier based on comparison of an amplitude of the reference radio frequency signal component of the digitized radio frequency signals and an amplitude of the reference radio frequency signal.

18. The magnetic resonance imaging method as set forth in claim 14, further including:
wireless transmitting the received radio frequency signals; and
synchronizing a wireless receiving of the wireless transmitted radio frequency signals with the wireless transmitting based on a phase shift between the reference radio frequency signal component of the digitized radio frequency signals and the reference radio frequency signal.

19. A magnetic resonance imaging method comprising:
exciting and spatially encoding a magnetic resonance signal;
generating a reference radio frequency signal;
concurrently receiving radio frequency signals including the excited and spatially encoded magnetic resonance signal and the reference radio frequency signal;
processing together the received radio frequency signals including both the received excited and spatially encoded magnetic resonance signal and the concurrently received reference radio frequency signal; and
correcting the processing of the received excited and spatially encoded magnetic resonance signal based on comparison of the concurrently received and processed reference radio frequency signal with the generated reference radio frequency signal.

20. The magnetic resonance imaging method as set forth in claim 19, further comprising:
transmitting the generated reference radio frequency signal by airwave transmission such that concurrent receiving of the reference radio frequency signal is via one or more radio frequency coils that also receive the excited and spatially encoded magnetic resonance signal.

* * * * *